United States Patent [19]

Paley et al.

[11] Patent Number: 5,010,300
[45] Date of Patent: Apr. 23, 1991

[54] MULTI-AXIS PRE-SATURATED SPIN ECHO PHASE ENCODED SPECTROSCOPY

[75] Inventors: Martyn N. J. Paley, Mayfield Village; James B. Murdoch, Solon; David A. Lampman, Lakewood; James M. McNally, Chagrin Falls, all of Ohio

[73] Assignee: Picker International, Inc., Highland Hts., Ohio

[21] Appl. No.: 440,894

[22] Filed: Nov. 22, 1989

Related U.S. Application Data

[63] Continuation-in-part of Ser. No. 7,392,480, Aug. 11, 1989.

[51] Int. Cl.$^5$ .......................................... G01R 33/20
[52] U.S. Cl. ................................. 324/309; 324/322
[58] Field of Search ............... 324/300, 307, 309, 310, 324/311, 312, 313, 314, 318, 322; 128/653 A

[56] References Cited

U.S. PATENT DOCUMENTS

4,742,304  5/1988  Schnall et al. ..................... 324/322

OTHER PUBLICATIONS

"Image Formation in NMR by a Selective Irraditive Process", by Garroway, et al., J. Phys. C: Solid State Phys., vol. 7, pp. L457-L462, 1974.
"Image-Selected in vivo Spectroscopy (ISIS), A New Technique for Spatially Selective NMR Spectroscopy", by Ordidge, et al., J. Mag. Res., 66, pp. 283-294 (1986).
"Computer-Optimized Narrowband Pulses for Multislice Imaging", by Murdoch, et al., J. Mag. Res., 74, pp. 226-263 (1987).
"Solvent Suppression in Fourier Transform Nuclear Magnetic Resonance", by P. J. Hore, J. Mag. Res., 55, pp. 283-300 (1983).
"In vivo $^1$H NMR Spectroscopy of the Human Brain by Spatial Localization and Imaging Techniques", by Luyten, et al., p. 327.
"The Utilization of Two Frequency Shifted Sinc Pulses for Performing Volume-Selected in vivo NMR Spectroscopy", by Doddrell, et al., Mag. Res. in Med., 3, pp. 970-975 (1986).
"Localization of Unaffected Spins in NMR Imaging and Spectroscopy (LOCUS Spectroscopy)", by Axel Haase, Mag. Res. in Med., 3, pp. 963-969 (1986).
"Discrete Isolation from Gradient-Governed Elimination of Resonances, DIGGER, a New Technique for in vivo volume-Selected NMR Spectroscopy", by Doddrell, et al., J. Mag. Res., 70, pp. 319-326 (1986).

Primary Examiner—Michael J. Tokar
Attorney, Agent, or Firm—Fay, Sharpe, Beall, Fagan, Minnich & McKee

[57] ABSTRACT

RF and gradient pulse combinations (30, 32, 36, 38) are applied to limit or define a region of interest in two dimensions (42) by pre-saturating surrounding regions (34a, 34b, 40a, 40b). A 90° RF pulse (50) is applied in the presence of a slice select gradient (60) to excite selected dipoles in a slice or slab, defining the region of interest or voxel in the third dimension. Phase encoding gradients (62) and (64) are applied to encode spatial position in two dimensions of the slice. A binomial refocusing pulse (52) suppresses the water and refocuses the metabolite resonance into an echo which is acquired (68) by a receiver (26). A Fourier transform means (72, 74) transforms the received magnetic resonance signals to create a two dimensional array (76) or matrix of spectra (78) corresponding to a two dimensional array of spatial positions within the slice. A third phase encode gradient (66) may be applied to encode the region of interest in three dimensions for generating a three dimensional array of the spectra.

15 Claims, 5 Drawing Sheets

MULTI-AXIS PRE-SATURATED SPIN ECHO PHASE ENCODED SPECTROSCOPY

This application is a continuation-in-part of U.S. application Ser. No. 392,480, filed Aug. 11, 1989.

BACKGROUND OF THE INVENTION

The present invention relates to the art of magnetic resonance spectroscopy. It finds particular application in conjunction with in-vivo examinations and will be described with particular reference thereto. However, it is to be appreciated that the invention may find further application in conjunction with spectroscopy examination of localized regions for imaging, chemical shift analysis, quality assurance, drug flow tracing, and the like.

When examining a complex structure, such as a region of a human patient, resonance may be excited in numerous different chemical compounds. To isolate a small volume of the region of interest or voxel, two techniques are commonly employed—phase encoding techniques and voxel localization techniques. In phase encoding techniques, phase encoding gradients are applied across the sample such that the resonance signals emanating from various locations across the sample are spatially encoded by this phase. In voxel localization, the signal is only recovered from a selected small volumetric element or voxel.

More specifically, phase encoding techniques typically provide spatial definition over a region whose size is defined by the sensitive volume of the receiver coil. Because the sensitive volume is determined by hardware geometry, it is substantially fixed from study to study with little attitude for adjustment.

One of the problems with phase encoding techniques is that they are susceptible to errors resulting from layers of different tissue types. The boundary layers between materials with different magnetic susceptibilities causes large magnetic field inhomogeneities that degrade water suppression and spatial resolution. Further, it is desirable to avoid the excitation of resonance in certain regions. Specifically, fat layers that surround the skull and other regions of the body commonly produce much larger magnetic resonance signals than metabolites of interest. The fat signal response can obscure the spectra of voxels of interest due to leakage of the point-spread function from neighboring voxels. In this manner, the fat signals degrade the dynamic range of the resultant signals limiting the ability to detect low concentrations of metabolites.

Voxel localization techniques, such as the technique described in U.S. Pat. No. 4,771,242, recover the signal from only a small voxel in the sample. To map or measure chemical concentrations over an extended region, a plurality of single voxel experiments are conducted. In each repetition, the voxel is defined at different location within the sample. Although this technique is accurate, it tends to be time consuming.

In another voxel localization technique described in "In-vivo 1H NMR Spectroscopy of the Human Brain by Spatial Localization and Imaging Techniques", by P. Luyten, et al., SMRM Book of Abstracts, page 327 (1988), a volume is selected with refocused stimulated echoes. This volume selection technique utilizes a series of 90° pulses. Phase encoding for one or two dimensional spectroscopic imaging is combined with the volume selection in order to suppress unwanted lipid signals from surrounding tissue. Although subvoxels can be defined within a relatively large voxel, this technique has several drawbacks. First, the 90° stimulated echo sequence recovers only half the signal. The other half is lost.

Secondly, these voxel techniques require three RF pulses in order to localize the voxel. Because the first RF pulse initially excites resonance, the time required for the following two pulses extends the duration between the first pulse excitation and data collection. Extending this duration limits the recovered signal to the contribution from dipoles with a longer T2 relaxation time.

The present invention provides a new and improved spatially encoded spectroscopy technique which overcomes the above referenced problems and others.

SUMMARY OF THE INVENTION

The present invention provides a spectroscopy technique in which resonance is excited with spin echo phase encoded localization in a voxel defined by pre-saturation.

In accordance with a more limited aspect of the present invention, pre-saturation RF pulses are applied to define the limits of a voxel of interest in two dimensions. The voxel is spatially encoded in the third direction with a single or multiple slice resonance echo technique. The excited resonance is phase encoded in two dimensions and data is collected during a resultant echo in the absence of a read gradient.

In accordance with a more limited aspect of the present invention, the collected resonance signal is subject to a one dimensional Fourier transform to extract spatially encoded frequency data followed by a two dimensional Fourier transform which creates a two dimensional matrix with a magnetic resonance spectrum corresponding to each element.

In accordance with another more limited aspect of the present invention, the excited resonance is limited to selected dipoles. For example, resonance signals from lipids may be suppressed. As another example, resonance may be excited in phosphorus dipoles.

Another aspect of the present invention is an apparatus that includes means for performing the above discussed steps.

One advantage of the present invention resides in its shorter delay to acquisition.

Another advantage of the present invention is its high signal-to-noise ratio. The full spin echo signal-to-noise ratio is attained.

Another advantage of the present invention is that it employs a single spin echo method with only two RF pulses which affect the metabolites of interest.

Still further advantages of the present invention include single shot localization for shimming, refocusing of field homogeneity errors, and the elimination of selective refocusing pulses.

Still further advantages of the present invention will become apparent to those of ordinary skill in the art upon reading and understanding the following detailed description of the preferred embodiments.

BRIEF DESCRIPTION OF THE DRAWINGS

The invention may take form in various steps and arrangements of steps or in various parts and arrangements of parts. The drawings are only for purposes of illustrating a preferred embodiment and are not to be construed as limiting the invention.

DETAILED DESCRIPTION OF THE PREFERRED EMBODIMENTS

Figure 1:
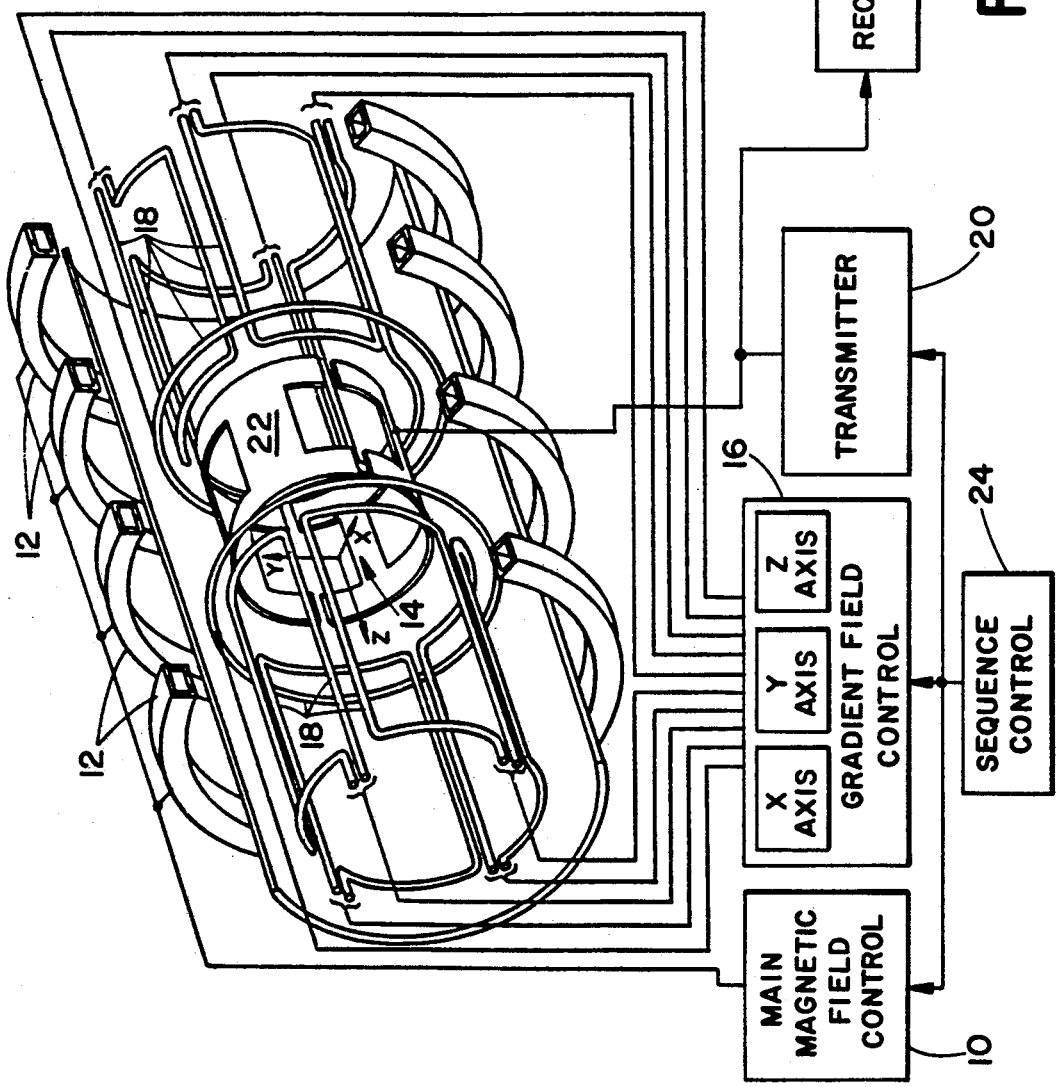
FIG. 1 is a diagrammatic illustration of a magnetic resonance imaging apparatus in accordance with the present invention.
Figure 1A:
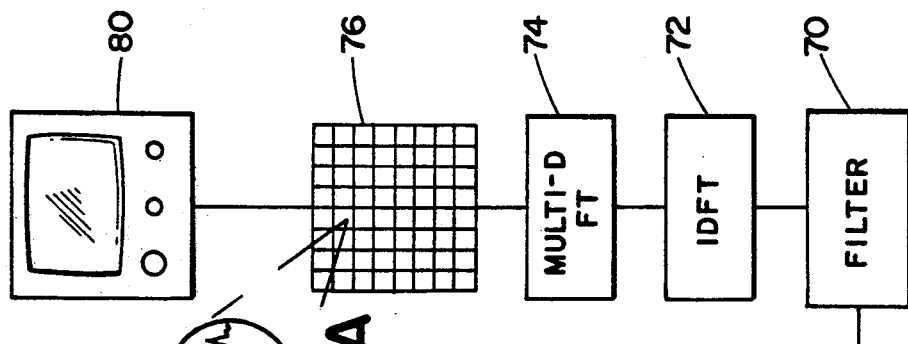

With reference to FIG. 1, a main magnetic field means including a main magnetic field control 10 and coils 12 generate a substantially uniform main magnetic field through an examination region 14. A gradient field means selectively causes magnetic field gradients across the main magnetic field in the examination region 14. In the preferred embodiment, the gradients are caused along three orthogonal axes, commonly denoted as x, y, and z. A magnetic field control 16 generates Current pulses of an appropriate amplitude, duration, and configuration so as to cause gradient field coils 18 to generate the selected magnetic field gradients across the examination region.

A radio frequency transmitter 20 transmits radio frequency signals into the examination region to pre-saturate dipoles in selected regions, to excite resonance, to refocus the resonance, and to perform other appropriate manipulations of the resonance. Radio frequency pulses from the transmitter 20 are applied to a radio frequency coil 22 that surrounds the examination region.

Figure 2:
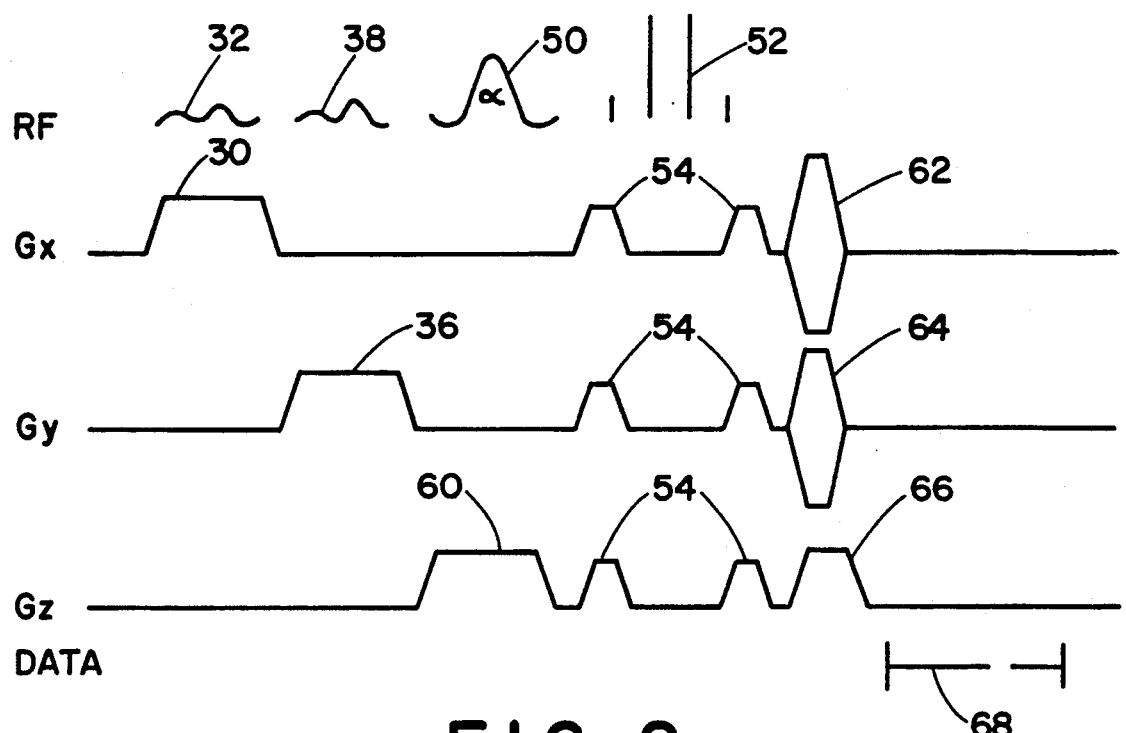
FIG. 2 is a preferred pulse sequence for generating spectroscopic data in accordance with the present invention.

With reference to FIG. 2, a sequence control means 24 controls the gradient magnetic field control 16 and the radio frequency transmitter 20 to transmit selected pulse sequences. The sequence control 24, the gradient field control 16, and the RF transmitter 20 incorporates means for defining a selected volume of the examination region 14 for exciting resonance in a selected slab or slice, and phase encoding resonance received from the slab or slice by a radio frequency receiver 26.

Figure 3:
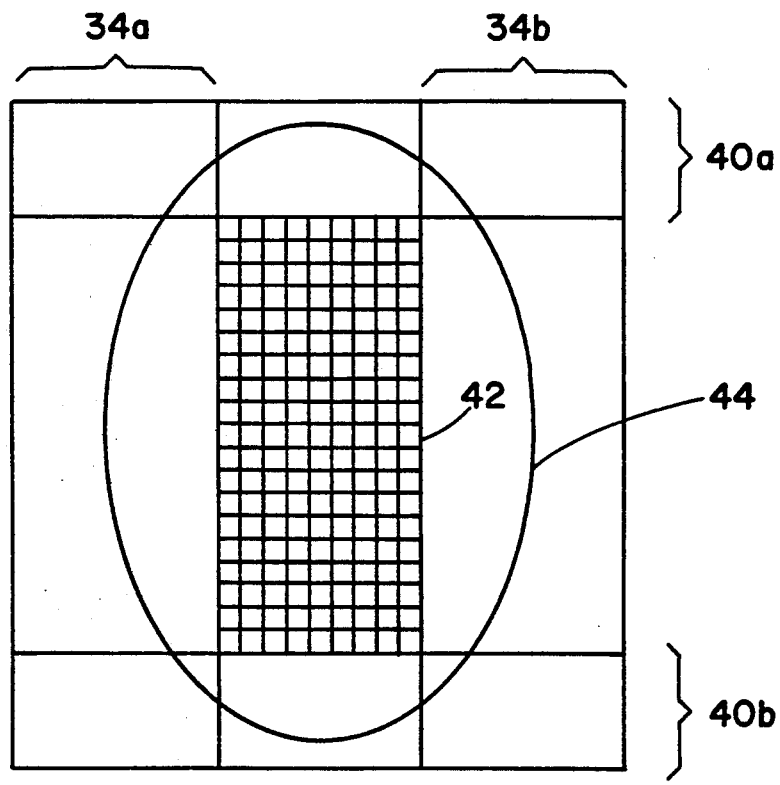
FIG. 3 illustrates subregions defined by the pulse sequence of FIG. 2.

With reference to FIG. 2, a pre-saturation gradient pulse 30 and a first pre-saturation radio frequency pulse 32 are applied concurrently to saturate the spins in regions 34a and 34b of FIG. 3. A gradient pulse 36 and radio frequency pulse configuration 38 are applied concurrently to presaturate spins in regions 40a and 40b of FIG. 3. In this manner, a voxel or columnar region of interest 42 is defined displaced away from a periphery 44 of a patient's head or other body part. This moves the imaged region away from the fat layer commonly found under the surface of the body portion. In order to define the edges of the voxel or columnar region sharply, the radio frequency pulses 32 and 38 are preferably bimodal pulses as described in "Computer-Optimized Narrowband Pulses for Multislice Imaging" by J.B. Murdoch, A.H. Lent, and M.R. Kritzer, J. Mag. Res., Vol. 74, pp 226-263 (1987), the text of Which is incorporated herein by reference. Unimodal pulses may also be utilized.

The spatial (non-frequency selective) pre-saturating pulses 32 and 38 remove the signal from the unwanted regions 34 and 40 on four sides of the region of interest 42, e.g. from the fat and the scalp around the head. The pulses are applied with an appropriate frequency offset in order to saturate the desired regions on either side of the voxel in multiple tilted planes.

Following the initial voxel preparation or definition, a spin echo sequence with two or more dimensions of phase encoding is applied. The spin echo is formed by applying an RF excitation pulse 50 with a flip angle o followed by a selective binomial refocusing pulse 52. The refocusing pulse is of the form of $2\beta\text{-}6\beta\text{-}6\beta\text{-}2\beta$. Preferably, $\alpha = 8\beta = 90°$. Dephasing gradient pulses 54 may be applied as necessary before and after the binomial pulse to dephase any unwanted transverse magnetization that might be generated.

In order to limit or define the voxel of interest in the third direction, a slice select gradient 60 is applied concurrently with the resonance exciting RF pulse 50. A first phase encoding gradient 62 and a second phase encoding gradient 64 apply phase encoding along two axes of the defined slice. The phase encode gradients may be applied either before or after the binomial refocusing pulse 52. The phase encode gradients provide spatial encoding along the defined slice. Optionally, a third phase encode gradient 66 may be applied to spatially encode the magnetic resonance symbol along the slice or slab to provide a resolvable three spatial dimensions of data.

A magnetic resonance echo peak forms the same duration after the binomial pulse as the duration by which the binomial pulse followed the excitation pulse 50. A data acquisition period 68 is defined to start collecting data at the center of the magnetic resonance echo and continue collecting data until the signal to noise ratio becomes unacceptably low.

With reference again to FIG. 1, the magnetic resonance echo is picked up by the radio frequency coil 22 or other radio frequency reception coil, such as a surface coil (not shown). The radio frequency receiver 70 is controlled by the sequence control means 24 in order to define the data acquisition period 68.

A filter 70 smooths the data to improve the signal and remove noise artifacts. A one dimensional Fourier transform means 72 removes spatially encoded frequency data. A two dimensional Fourier transform 74 of the two dimensionally phase encoded data separates frequency spectra by spatial location. If the data is phase encoded in three dimensions, a three dimensional Fourier transform is performed. A memory means 76 defines a two dimensional matrix of memory addresses corresponding to the two dimensional array of subregions in the defined voxel or region of interest 42. Each memory address stores an NMR frequency data set 78 representative of the frequency spectrum generated by the nuclei in the corresponding subregion. If it were desirable to form an image from this data, one would select the same part of each frequency spectrum 78 to define the gray scale for the corresponding element or pixel of the image.

A display means so, such as a video monitor, selectively displays the frequency data from the first Fourier transform means 72, the frequency spectra 78 from one or more of the matrix elements, or a gray scale image corresponding to a selected part of the frequency spectrum. The spectra may be analyzed by computer to generate a direct display of one or more of the chemical constituents of the corresponding subregion. For example, an image of relative concentration of a selected constituent in each region may be displayed. Optionally, the phase encoding may be limited to one axis. When phase encoded in the third direction, a three dimensional array of frequency spectra is defined corresponding to a plurality of effective slices as may be defined by the phase encode gradient 66.

Figure 4:
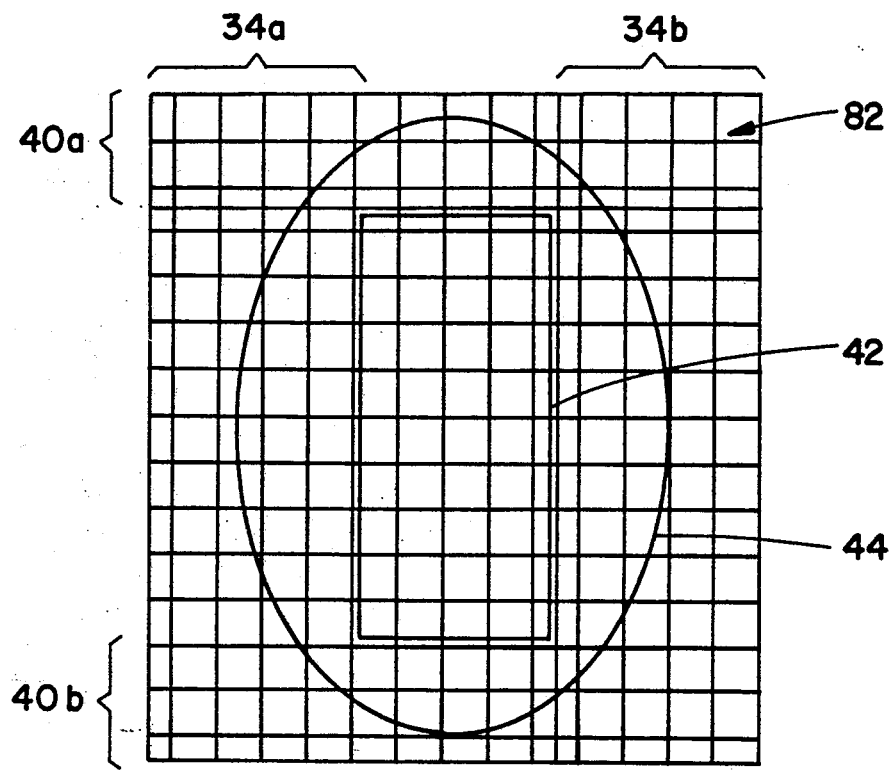
FIG. 4 illustrates subregions defined by an alternate embodiment of FIG. 2 in which both phase encode gradients have larger steps.
Figure 5:
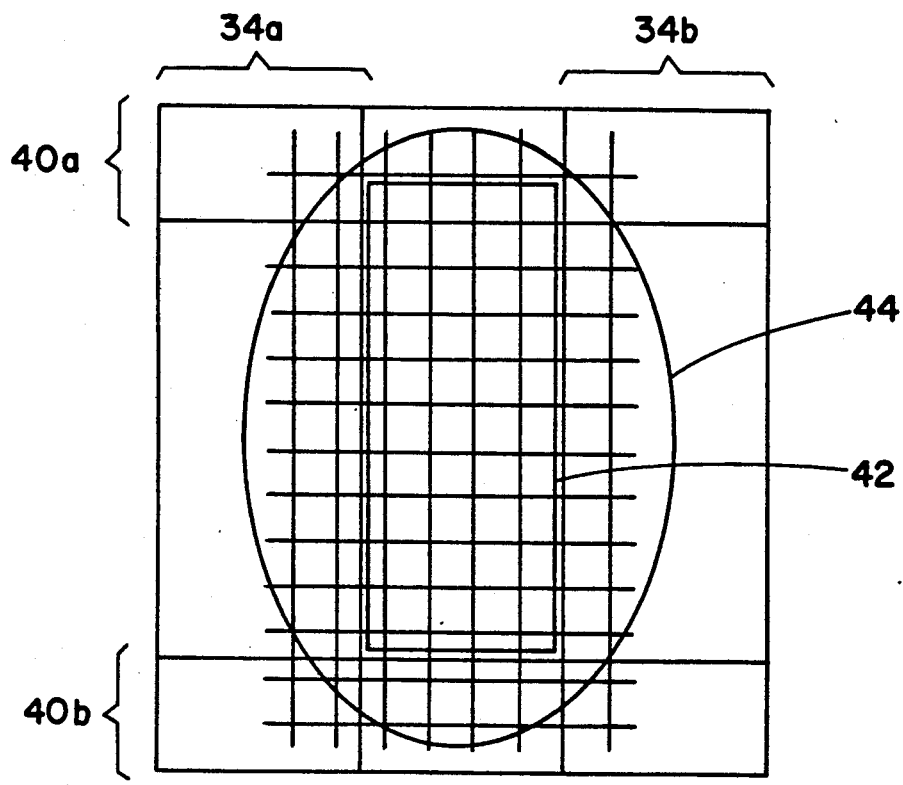
FIG. 5 illustrates subregions defined by another alternate embodiment in which one of the phase encode gradients is stepped in larger increments.

The size of the phase encoded region relative to the pre-saturated/selected region or voxel is important in terms of the aliasing of the signal in the acquisition region. In the method graphically depicted in FIG. 3, the phase encoded region is totally within the pre-saturated/selected region. In an embodiment depicted in FIG. 4, the phase encoding is sized to extend over a region 82 that extends beyond the defined voxel or region of interest 42. The phase encode gradient pulses 60 and 62 are enlarged such that each array element is larger causing the region to which phase encoding is applied to overlap a portion of the saturated regions 34, 40. Alternately, as depicted in FIG. 5, the phase encoding may be enlarged along one axis to overlap a portion of periphery 44. The phase encoding is utilized to identify and remove signals emanating from the pre-saturated region. In the embodiment of FIG. 3, the large signals from fat tend to bleed back into the voxel 42 because the pre-saturated dipoles can generate frequency components which are indistinguishable from the portions of the signals emanating from the selected voxel 42. The phase encoding of these out-of voxel signals in FIGS. 4 and 5 enable them to be identified for removal.

Figure 6:
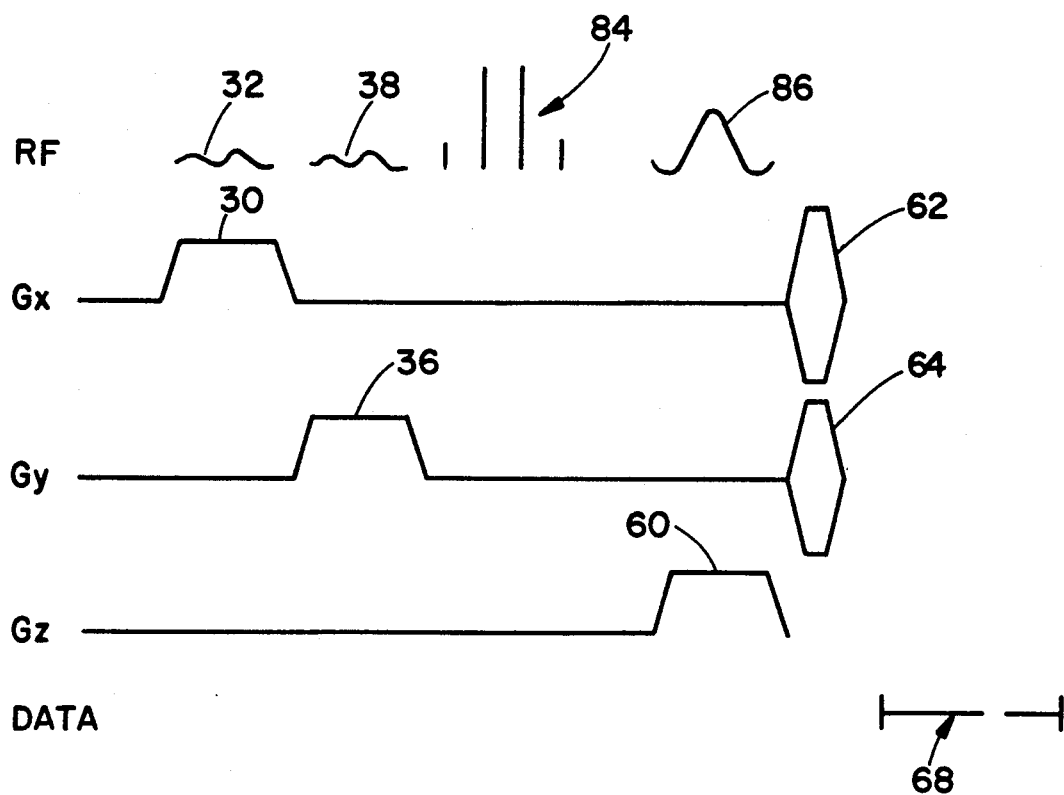
FIG. 6 is an alternate gradient sequence.

With reference to FIG. 6, other imaging sequences may also be implemented satisfactorily. In the embodiment of FIG. 6, pre-saturation gradient and radio frequency pulse combinations 30, 32 and 36, 38 again pre-saturate the spins in regions 34 and 40. A binomial excitation pulse 84 of the form $\alpha$-$3\alpha$-$3\alpha$-$\alpha$ is followed by a bi- or unimodal refocusing pulse 86 applied concurrently with the slice select gradient 60. The refocusing pulse is of amplitude $\beta$. Preferably, $16\alpha = \beta = 180°$. Typically, the binomial pulse 84 is a 90° pulse, but may have smaller angles where different contrasts are desired. Spatial position encoding gradient pulses 62 and 64 are applied after, or before, the refocusing pulse 86 such that the magnetic resonance echo data received during the acquisition period 68 is phase encoded as an indicia of location. Dephasing gradients may again be applied as necessary to dephase any transverse magnetization generated by the refocusing pulse/slice select gradient pulse combination.

Figure 7:
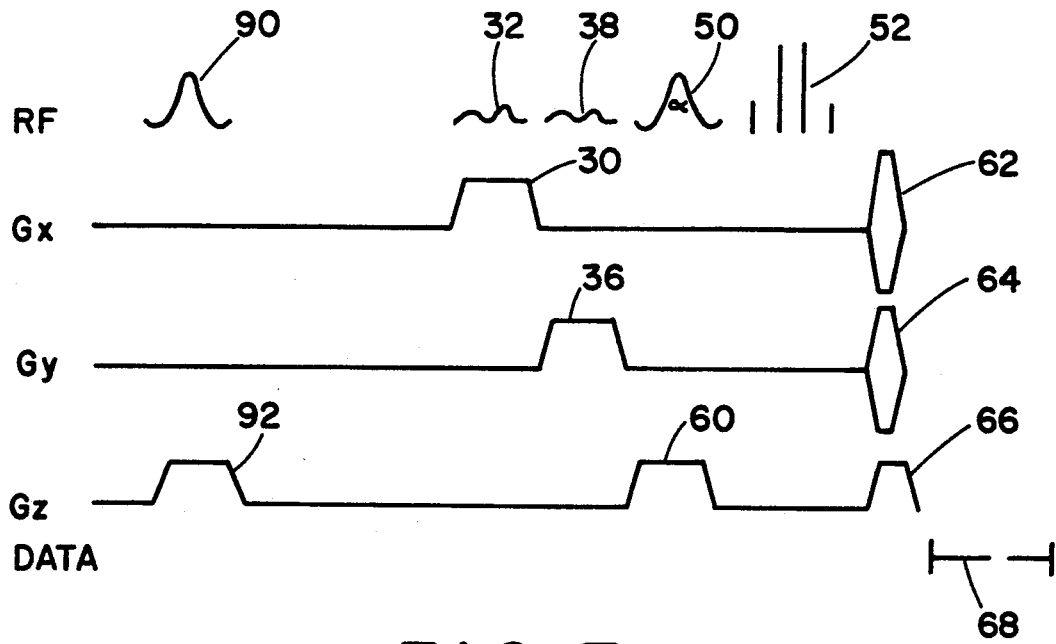
FIG. 7 is an inversion recovery pulse sequence for collecting data in accordance with the present invention.

With reference to FIG. 7, other conventional imaging sequences, such as an inversion recovery sequence, can be adapted to the present technique. In the inversion recovery sequence, an inversion pulse 90, such as a 180° pulse, is applied concurrently with a slice select gradient 92. A duration later, which duration is calculated to be long enough for the T2 contribution to have attenuated significantly, the pre-saturation gradient and RF pulse combinations 30, 32 and 36, 38 are applied. The 90° RF pulse 50 is applied concurrently with the slice select gradient 60 followed by a binomial inversion pulse 52 to cause T1 weighted echo. Phase encode gradients 62 and 64 may be applied on either side of the binomial pulse 52 such that the echo which forms during the data acquisition period 68 is spatially encoded. Optionally, the slice may be phase encoded in the third direction by phase encode gradient 66 for volumetric imaging.

Figure 8:
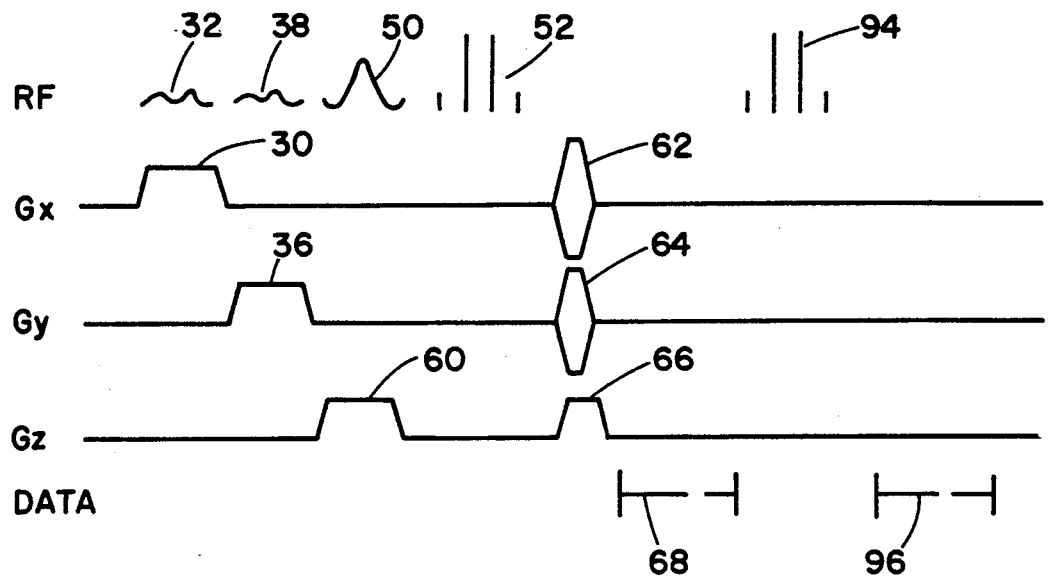
FIG. 8 is a diagrammatic illustration of a multi-echo pulse sequence for acquiring spectroscopy data in accordance with the present invention; and, FIG. 9 is a non-echo sequence in accordance with the present invention.

With reference to FIG. 8, the present invention may also be applicable to multi-echo sequences. Analogously to the sequence of FIG. 2, pre-saturation gradient and RF pulse pairs 30, 32 and 36, 38 are applied to pre-saturated regions 34 and 40. The excitation pulse 50 applied in the presence of the slice select gradient 54 excites resonance in the selected slice or slab. The binomial inversion pulse 52 inverts the magnetization to refocus in an echo in the data acquisition period 68. One or more of phase encode gradients 62, 64, and 66 are applied to encode spatial information in the resultant echo. Following the first echo, another selective refocusing pulse 94 is applied to invert the magnetization to refocus in a second echo. The receiver is controlled to provide a second data acquisition period 96 for monitoring the second echo. The second echo tends to be more heavily weighted toward T2 spectra than the first echo.

Figure 9:
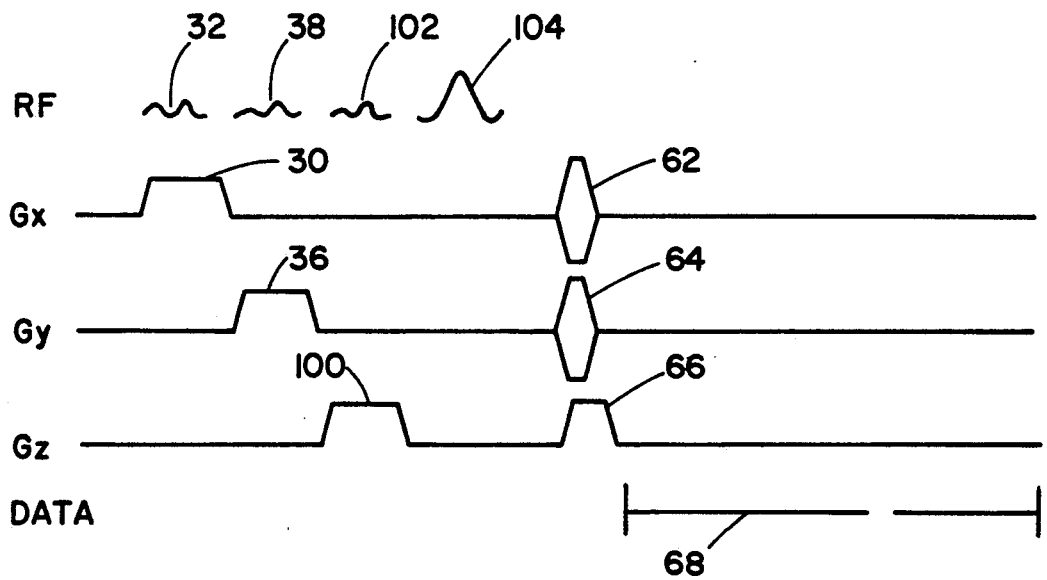

With reference to FIG. 9, the present invention is also applicable to non-echo encoding techniques. For example, when directing the analysis to phosphorus, presaturating RF and gradient pulse pairs 30, 32; 36, 38; and 100, 102 pre-saturate regions of the patient surrounding a three dimensional voxel of interest. A 90° broadband excitation pulse 104 is applied to excite resonance within the voxel and a free induction decay resonance signal. The phase encoding gradients 62, 64, or 66 are applied along one or more of the axes in order to phase encode the resonance in up to three dimensions. The phase encoded free induction decay signal from the resonating phosphorus 31 nuclei are monitored by the receiver 26 during the data acquisition period 68. One advantage of this encoding scheme is that the region over which shimming occurs is limited resulting in higher homogeneity. Because no spin echo is formed, a linear phase shift is observed in the data that may be corrected using linear prediction methods. When this non-echo technique is used for proton spectroscopy, it is preferred that the 90° excitation pulse have a binomial pulse configured to suppress water. This technique, again, has linear phase shift problems but is advantageous in that the data acquisition period follows the excitation even more closely than the echo sequences.

The invention has been described with reference to the preferred embodiments. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiments, the invention is now claimed to be:

1. A method of magnetic resonance spectroscopy comprising:
   defining a region of interest by pre-saturating regions therearound;
   exciting resonance in the region of interest;
   encoding spatial locations along at least one direction by phase encoding the excited resonance along the selected direction;
   collecting resonance data in the absence of a magnetic field gradient and Fourier transforming the collected data into an array of spectra, each spectrum corresponding to the resonance signal from a spatial section along the phase encode direction.

2. The method as set forth in claim 1 further including phase encoding the resonance in at least a second direction and wherein the Fourier transforming step includes Fourier transforming the collected data into a two dimensional array of spectra.

3. The method as set forth in claim 1 further including refocusing the excited resonance to converge into an echo and wherein the data collecting step includes collecting the resonance data during the echo.

4. The method as set forth in claim 3 wherein the phase encoding step includes phase encoding the excited resonance along at least two dimensions such that the Fourier transforming step transforms the received echo data into a two dimensional array of spectra.

5. The method as set forth in claim 4 wherein the refocusing step includes applying a refocusing radio frequency pulse concurrently with a slice select gradient such that the refocusing of the excited resonance is limited to a selected slice.

6. The method as set forth in claim 4 further including applying a slice select gradient concurrently with the exciting of resonance.

7. The method as set forth in claim 4 wherein in the resonance excitation step, magnetic resonance is excited in selected hydrogen dipoles.

8. The method as set forth in claim 7 wherein at least one of the resonance exciting and refocusing steps includes the application of a binomial radio frequency pulse to suppress water.

9. The method as set forth in claim 7 wherein the resonance exciting step includes the application of a radio frequency pulse of up to 90°.

10. The method as set forth in claim 2 wherein the resonance exciting step includes exciting magnetic resonance in phosphorus dipoles.

11. The method as set forth in claim 4 wherein the pre-saturating step includes concurrently applying a first radio frequency and gradient pulse combination to pre-saturate material on a first pair of opposite sides of the region of interest and applying a second radio frequency and gradient pulse combination to saturate material on a second pair of opposite sides of the region of interest, the first opposite sides being generally orthogonal to the second opposite sides.

12. A method of generating a magnetic resonance spectrum corresponding to each of an at least two dimensional array of subregions of a region of interest, the method comprising:
applying radio frequency and gradient pulse combinations for saturating material on four sides of the region of interest along first and second axes;
concurrently applying a radio frequency pulse for exciting magnetic resonance in the region of interest and a slice select gradient for limiting the excited region along a third axis;
applying phase encode gradients for phase encoding the excited resonance along at least two directions;
collecting resonance data in the absence of a magnetic field gradient;
multi-dimensionally Fourier transforming the collected resonance data into an at least two dimensional array of multi-frequency spectra.

13. An apparatus for magnetic resonance spectroscopy, the apparatus comprising:
means for concurrently applying combinations of radio frequency and gradient pulses for pre-saturating material around a region of interest;
means for applying a radio frequency excitation pulse to excite magnetic resonance in the region of interest;
means for applying a spatial position encoding gradient pulse for encoding position along a first direction;
means for receiving a magnetic resonance signal in the absence of a magnetic field gradient;
a Fourier transform means for Fourier transforming the received magnetic resonance signal into an array of spectra, each spectra corresponding to a different spatial location along the encoded direction.

14. The apparatus as set forth in claim 13 wherein the position encoding means includes a phase encoding means for applying at least two phase encoding magnetic field gradients to encode spatial position in the resonating signals along the first direction and along a second direction and wherein the Fourier transform means includes a multi-dimensional Fourier transform means for transforming the received magnetic resonance signals into a two dimensional array of spectra.

15. The apparatus as set forth in claim 13 further including means for applying a refocusing pulse for refocusing the excited magnetic resonance into an echo, the receiver means receiving the magnetic resonance signal during the echo.

* * * * *